(12) United States Patent
Lin (10) Patent No.: US 8,441,067 B2
(45) Date of Patent: May 14, 2013

(54) POWER DEVICE WITH LOW PARASITIC TRANSISTOR AND METHOD OF MAKING THE SAME

(75) Inventor: Wei-Chieh Lin, Hsinchu (TW)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 25 days.

(21) Appl. No.: 13/070,479

(22) Filed: Mar. 24, 2011

(65) Prior Publication Data

US 2012/0146138 A1 Jun. 14, 2012

(30) Foreign Application Priority Data

Dec. 13, 2010 (TW) ................................ 99143440 A (51) Int. Cl.
*H01L 29/94* (2006.01)
(52) U.S. Cl.
USPC .................... 257/330; 257/332; 257/E21.419

(58) Field of Classification Search .......... 257/328–330, 257/332, 341, E21.419; 438/270, 589
See application file for complete search history.

(56) References Cited

U.S. PATENT DOCUMENTS

2007/0020850 A1* 1/2007 Takaishi ........................ 438/259

* cited by examiner

*Primary Examiner* — Jack Chen
(74) *Attorney, Agent, or Firm* — Winston Hsu; Scott Margo (57) ABSTRACT

The power device with low parasitic transistor comprises a recessed transistor and a heavily doped region at a side of a source region of the recessed transistor. The conductive type of the heavily doped region is different from that of the source region. In addition, a contact plug contacts the heavily doped region and connects the heavily doped region electrically. A source wire covers and contacts the source region and the contact plug to make the source region and the heavily doped region have the same electrical potential.

14 Claims, 13 Drawing Sheets

POWER DEVICE WITH LOW PARASITIC TRANSISTOR AND METHOD OF MAKING THE SAME

BACKGROUND OF THE INVENTION

1. Field of the Invention

The present invention relates generally to a method of fabricating a power device. More particularly, the present invention relates to a power device with low parasitic transistor and a fabrication method thereof.

2. Description of the Prior Art

A power device is mainly used in power management, for instance, being applied in a switching power supply, a management integrated circuit in the core or a peripheral region of computer, a backlight power supply, and in an electric motor control. The type of the power devices described above include an insulated gate bipolar transistor (IGBT), a metal-oxide-semiconductor field effect transistor (MOSFET), and a bipolar junction transistor (BJT), among which the MOSFET is widely applied in various domains because of its energy saving properties and ability to provide faster switch speed.

It has been the trend to scale down the sizes of integrated circuit devices to increase the integration level and density. However, as the distance between devices is decreased, parasitic transistors form more easily within semiconductor regions with different conductive types. In addition, as the sizes of devices are decreased, the distance between source doped region and drain doped region is shortened, leading to the decrease of breakdown voltage and the occurrence of current leaking.

Therefore, it is necessary to invent a novel structure and a fabrication method of a power device to solve the problems such as breakdown voltage, current leaking, and parasitic transistors in a convenient and economical way.

SUMMARY OF THE INVENTION

One of the purposes of the invention is to provide a fabrication method and structure of power semiconductor device. The invention can solve the problems such as breakdown voltage, current leaking, and parasitic transistor in a convenient and economical way.

According to the present invention of the power device with low parasitic transistor, the invention includes a power device with low parasitic transistor comprising a substrate including a body, a first semiconductor layer, and a second semiconductor layer disposed on the substrate in sequence, wherein the substrate is divided into an active region and a peripheral region, a trench type transistor located in the active region of the substrate, and the trench type transistor comprising a first recessed gate structure embedded into the second semiconductor layer and extending into the first semiconductor layer, and a source doped region located at two sides of the first recessed gate structure, wherein the first semiconductor layer serves as a drain doped region of the trench type transistor, a first heavily doped region disposed in the second semiconductor layer within the active region, and the first heavily doped region being disposed at one side of the source doped region, wherein the first heavily doped region and the second semiconductor layer have the same conductive type, a first contact plug disposed in the second semiconductor layer, and the bottom of the contact plug contacting the first heavily doped region, a source wire covering the second semiconductor layer on active region, and a source wire contacting the top of the drain doped region within the active region and the top of the first contact plug.

In another aspect, a method of fabricating a power device with low parasitic transistor includes providing a substrate comprising a body, a first semiconductor layer, and a second semiconductor layer deposited on the substrate in sequence, at least one trench disposed in the first semiconductor layer and the second conductor layer, a gate oxide layer disposed on a sidewall of the trench and on the top surface of the second semiconductor layer, a gate material layer disposed inside the trench, wherein the top surface of the gate material layer is lower than the top surface of the second semiconductor layer. A first ion implantation process is performed to form a first heavily doped region in the second semiconductor layer, where the first heavily doped region contacts part of the sidewall of trench and contacts the gate oxide layer on the top of the second semiconductor layer. A first insulating layer is formed on the second semiconductor layer and the first insulating layer filling into the trench. A planarization process is performed to remove part of the first heavily doped region and part of the first insulating layer on the second semiconductor layer until the planarized top surface of the second semiconductor layer is lower than the top surface of the first insulating layer, and at least one source doped region is formed within the first heavily doped region at the side of the trench. A first contact hole is formed in the second semiconductor layer at a side of the source doped region.

A second ion implantation process is performed to form a second heavily doped region in the second semiconductor layer which is around the bottom of the first contact hole, wherein the conductive type of the second heavily doped region is the same as that of the second semiconductor layer. A first contact plug is formed in the first contact hole and the first contact plug contacts the second heavily doped region. A source wire is formed which covers the contact plug and the source doped region. In another aspect, in accordance with another embodiment of this invention, a method of fabricating a power device with low parasitic transistor includes a substrate comprising a body, a first semiconductor layer, and a second semiconductor layer disposed on the substrate in sequence. The substrate is divided into an active region and a peripheral region, with at least two trenches being disposed in the first semiconductor layer and the second semiconductor layer within the active region and the peripheral region. A gate oxide layer is disposed on a sidewall of each of the two trenches and on the top surface of the second semiconductor layer. A gate material layer is filled into the trenches, wherein the top surface of the gate material layer is lower than the top surface of the second semiconductor layer. Then, a first ion implantation process is performed to form a first heavily doped region in the second semiconductor layer. The first heavily doped region contacts part of the sidewall of each of the trenches and contacts the gate oxide layer on the top surface of the second semiconductor layer. A first insulating layer is formed on a second semiconductor layer, and the first insulating layer is filled into each of the trenches. A planarization process is performed to remove part of the first insulating layer, part of the gate oxide layer, part of the first heavily doped region and part of the second semiconductor layer until the planarized top surface of the second semiconductor layer is lower than the top surface of the first insulation layer, wherein at least one source doped region is formed within the first heavily doped region at the side of each of the trenches during the planarization process. Then, a dielectric layer, a first contact hole, and a second contact hole are formed, wherein the dielectric layer covers at least part of the second semiconductor layer, the first contact hole is disposed in the second semiconductor layer at the side of the source doped region, the second contact hole is located in the dielectric layer within the peripheral region, in the first insulating layer, and in the gate material. This is followed by performing a second ion implantation process to form a second heavily doped region in the second semiconductor layer around the bottom of the first contact hole, wherein the conductive type of the second heavily doped region is the same as that of the second semiconductor layer. A first contact plug is formed in the first contact hole and the first contact plug contacts the second heavily doped region. A second contact plug is formed in the second contact hole and the second contact plug contacts a gate material layer. Finally, a source wire and a gate wire are formed, wherein the source wire covers the first contact plug and the source doped region, and the gate wire covers the second contact plug and the dielectric layer.

The invention increases the P-type dopant concentration of the doped region to prevent the depletion region from contacting with the source doped region while applying voltage, which results in solving the problem of the parasitic transistor, increasing the breakdown voltage of the device, and reducing the current leaking. In addition, the fabrication process is applied in an economical and convenient way because there is no increase in the number of the photomasks.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIG. 1 to FIG. 10. FIG. 1 to FIG. 10 are schematic, cross-sectional diagrams illustrating a method of fabricating a power device with low parasitic transistor in accordance with a first embodiment of this invention. It should be noted that the diagrams are used for interpretation purposes and are not drawn in the original size or scale.

Figure 1:
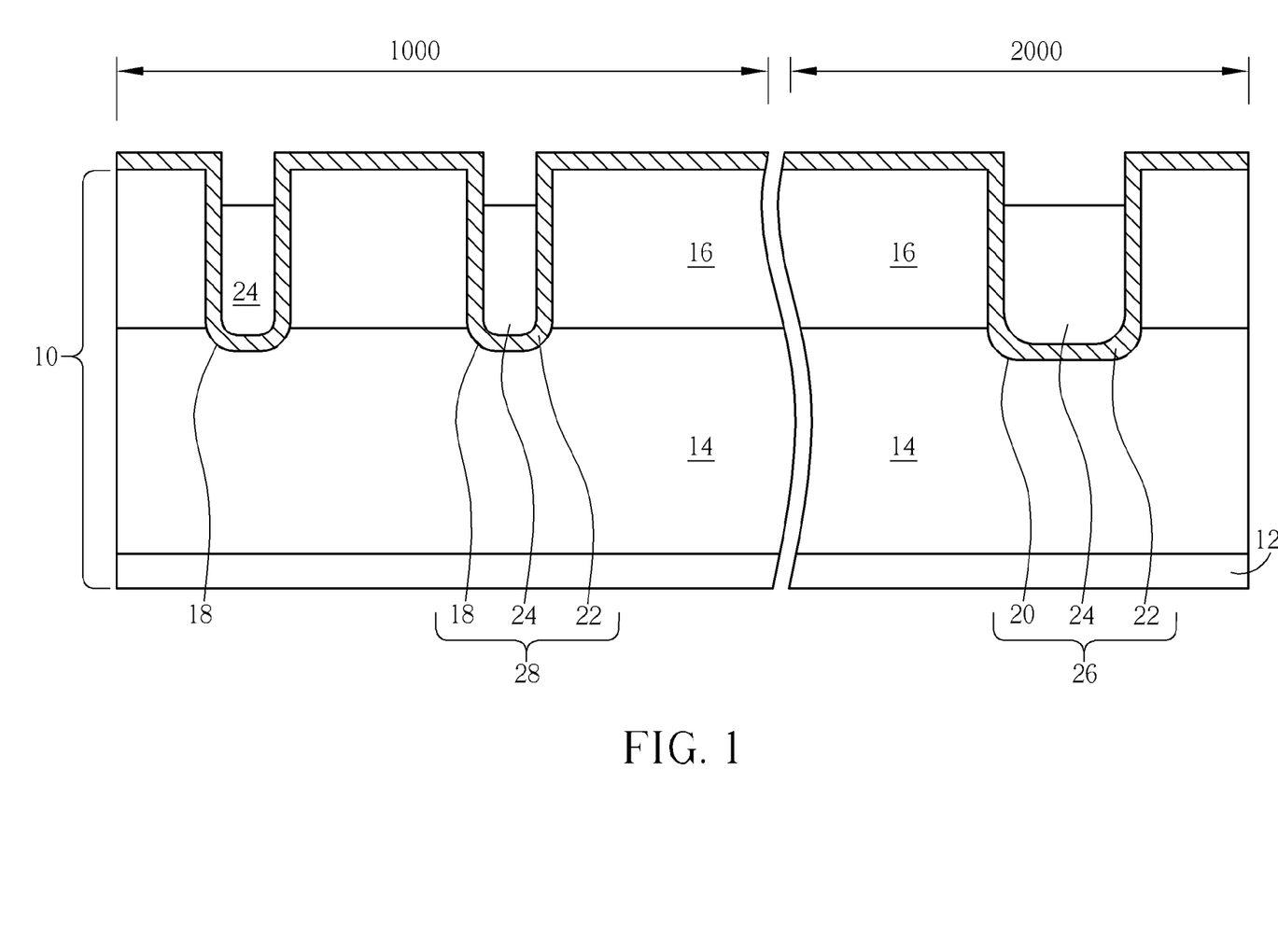
FIGS. 1-10 are schematic, cross-sectional diagrams showing a method of fabricating a power device with low parasitic transistor in accordance with the first embodiment of this invention.

As shown in FIG. 1, a substrate 10 is provided. The substrate 10 comprises a body 12, a first semiconductor layer 14, and a second semiconductor layer 16 disposed on the body 12 in sequence. The body 12 may comprise silicon such as silicon doped with $N^+$ or $P^+$ dopants, and the first semiconductor layer 14 which has the same conductive type with the body is formed by epitaxy growth process. The first semiconductor layer 14 serves as a source doped region after the power device is formed. The second conductor layer 16, which has the conductive type opposed to the first semiconductor layer 14, is formed on the first semiconductor layer 14 by an ion implantation process. According to a preferred embodiment of the invention, the body 12 is $N^+$ type, the first semiconductor layer 14 is an $N^-$ type epitaxy layer, and the second semiconductor layer 16 is a P-type doped region. Besides, the substrate 10 can be divided into an active region 1000 and a peripheral region 2000.

These steps are followed by forming at least two trenches 18, 20 located at an active region 1000 and a peripheral region 2000 within the second semiconductor layer 16, respectively. Each of the trenches 18, 20 extends from the second semiconductor layer 16 to the first semiconductor layer 14, and then a gate oxide layer 22 is disposed at the sides and the bottom of each of the trenches 18, 20 and on the surface of the second semiconductor layer 16. A gate material layer 24 fills inside the trenches 18, 20 and is formed on the gate oxide layer 22 while the top surface of the gate material layer 24 is lower than the top surface of the second semiconductor layer 16. The gate oxide layer 22 may comprise silicon oxide and the gate material layer 24 may comprise doped polysilicon. By far, trenches 18, 20, the gate oxide layer 22, and the gate material layer 24 together form numerous recessed gate structures 26, 28.

Figure 2:
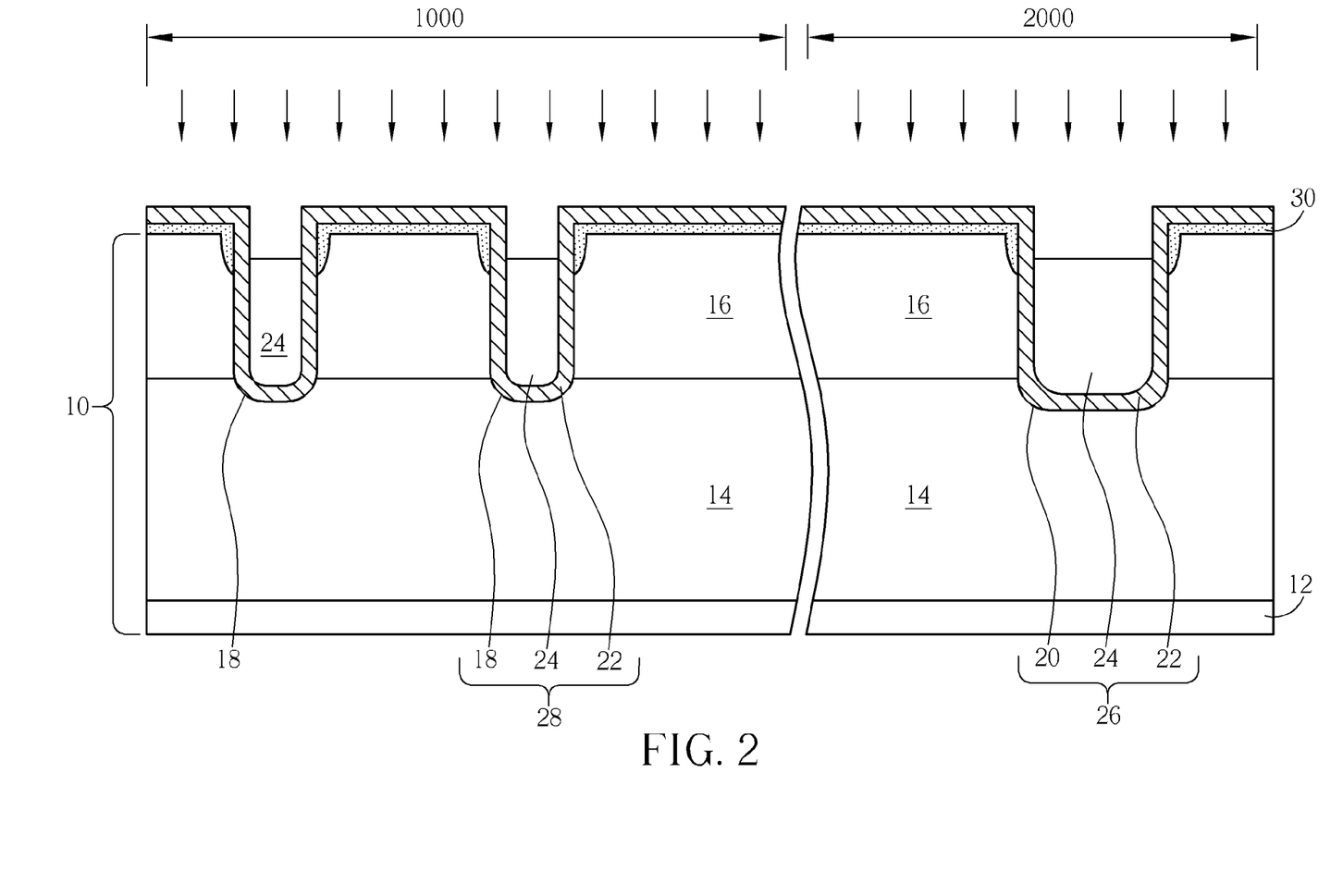

As shown in FIG. 2, at least an ion implantation process is performed to form a heavily doped region 30, such as an N-type heavily doped region, within the second semiconductor layer 16.

The ion implantation process could be a vertical ion implantation or a tilted ion implantation or a combination thereof. The heavily doped region 30 is formed on the top of the second semiconductor layer 16 and adjacent to part of the sidewall of the trenches 18, 20.

Figure 3:
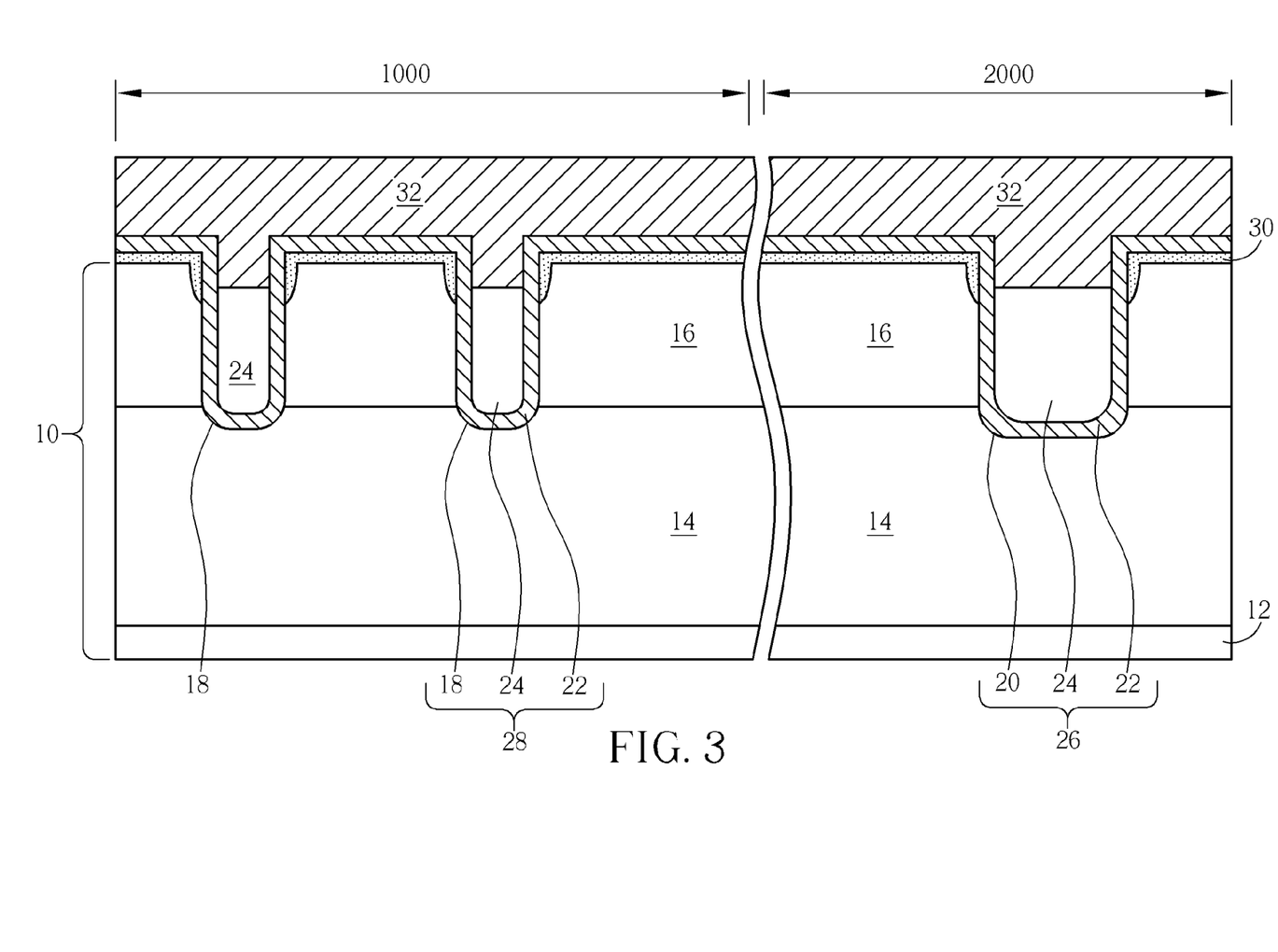
Figure 4:
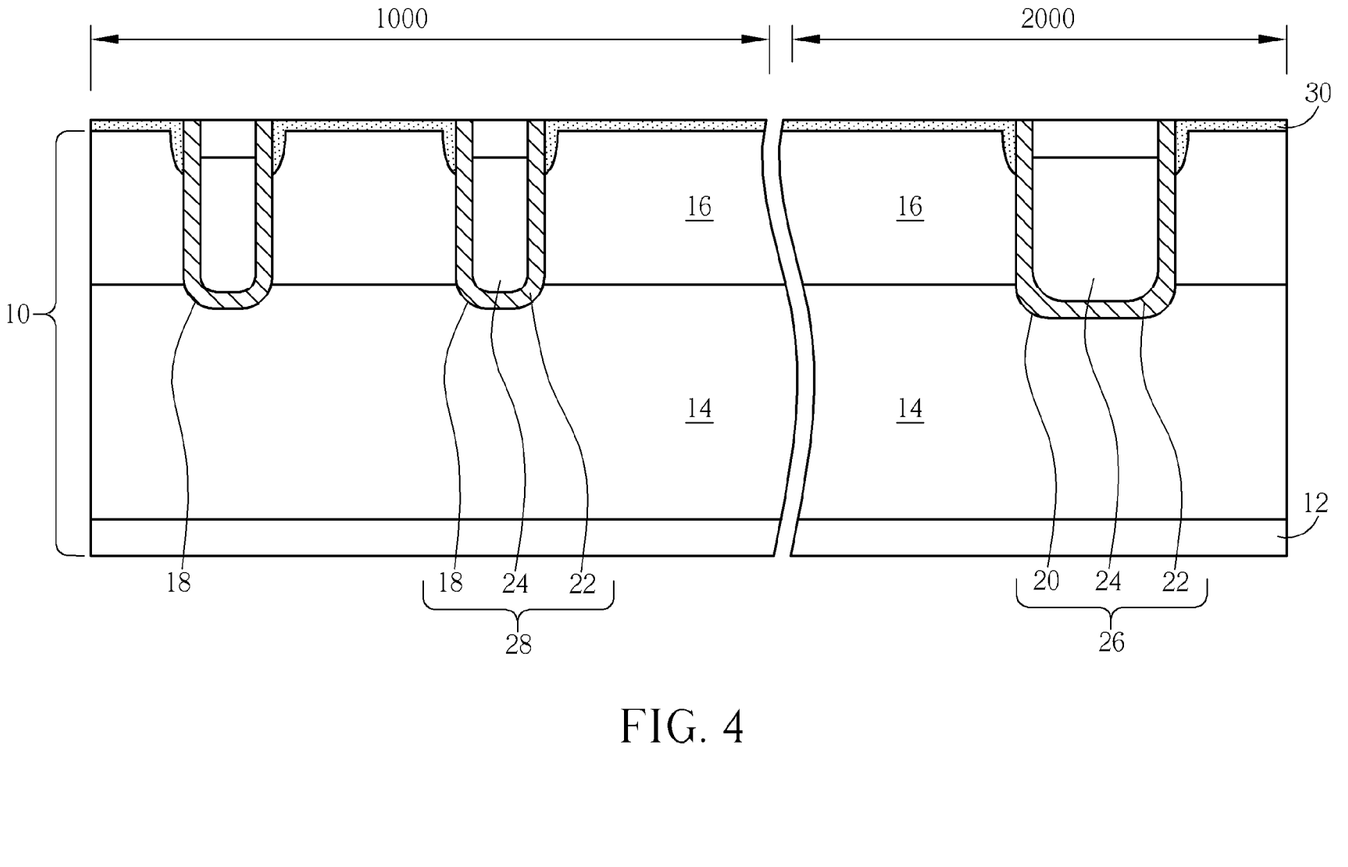
Figure 5:
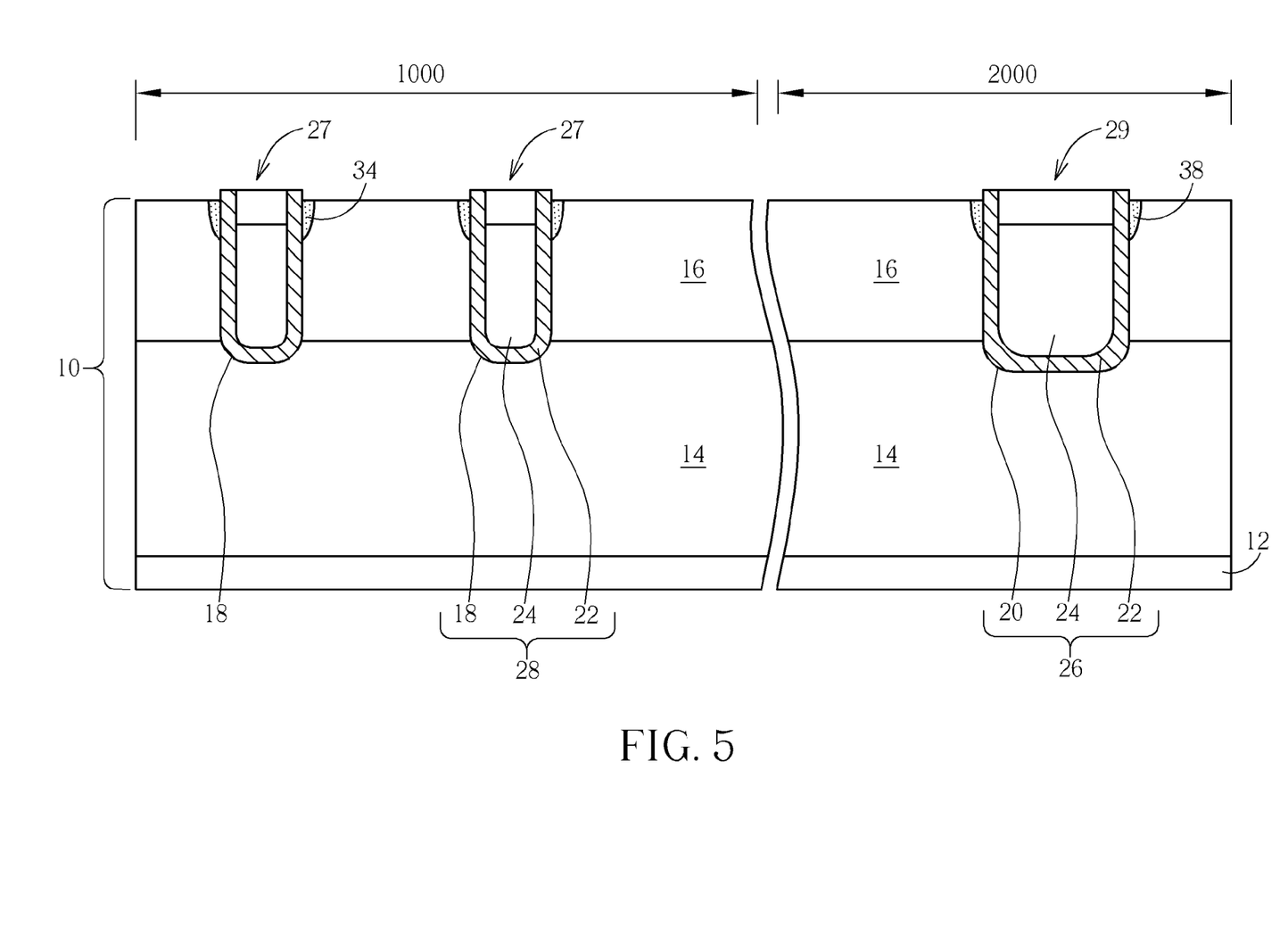

As shown in FIG. 3, an insulating layer 32 is formed on the gate oxide layer 22 and filled into each of the trenches 18, 20, wherein the insulating layer 32 may comprise low-k material such as borosilicate glass (BSG), phosphosilicate glass, boro-phosphosilicate glass (BPSG), un-doped silicon glass or fluorosilicate glass. As shown in FIG. 4 and FIG. 5, a planarization process is performed. The planarization process includes a chemical mechanical polishing process and an etching back process. Please refer to FIG. 4. First, the chemical mechanical polishing process is performed to remove the insulating layer 32 and the gate oxide layer 22 from the surface of the second semiconductor layer 16. After the process described above, the top surface of the heavily doped region 30 is aligned with the top surface of the insulating layer 32 inside the trenches 18, 20.

As shown in FIG. 5, the second semiconductor layer 16 is etched back to remove the heavily doped region 30 on the top surface of the second semiconductor layer 16. The second semiconductor layer 16 is preferably to be etched back about 0.05-0.2 μm. After that, the heavily doped region 30 at two sides of the trenches 18, 20 forms source doped regions 34, 38. The top surface of the second semiconductor layer 16, after the etching back process, is lower than the top surface of the insulating layer 32 inside the trenches 18, 20. Then, a thermal treatment is applied to the substrate 10 to diffuse the source doped regions 34, 38. At this time, the recessed gate structures 26, 28, the first semiconductor layer 14, and the source doped regions 34, 38 form numerous the trench type transistors 27, 29.

Figure 6:
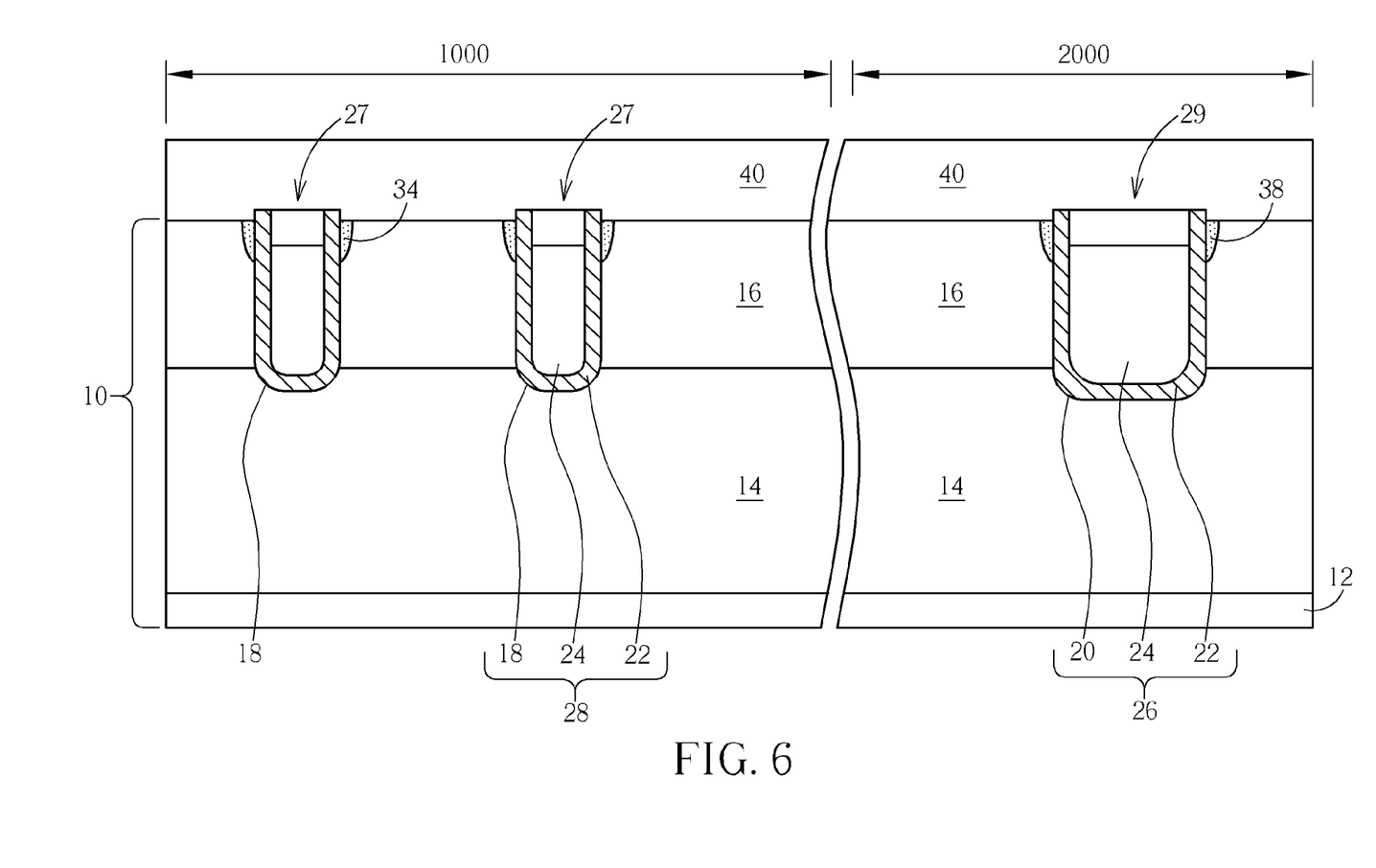
Figure 7:
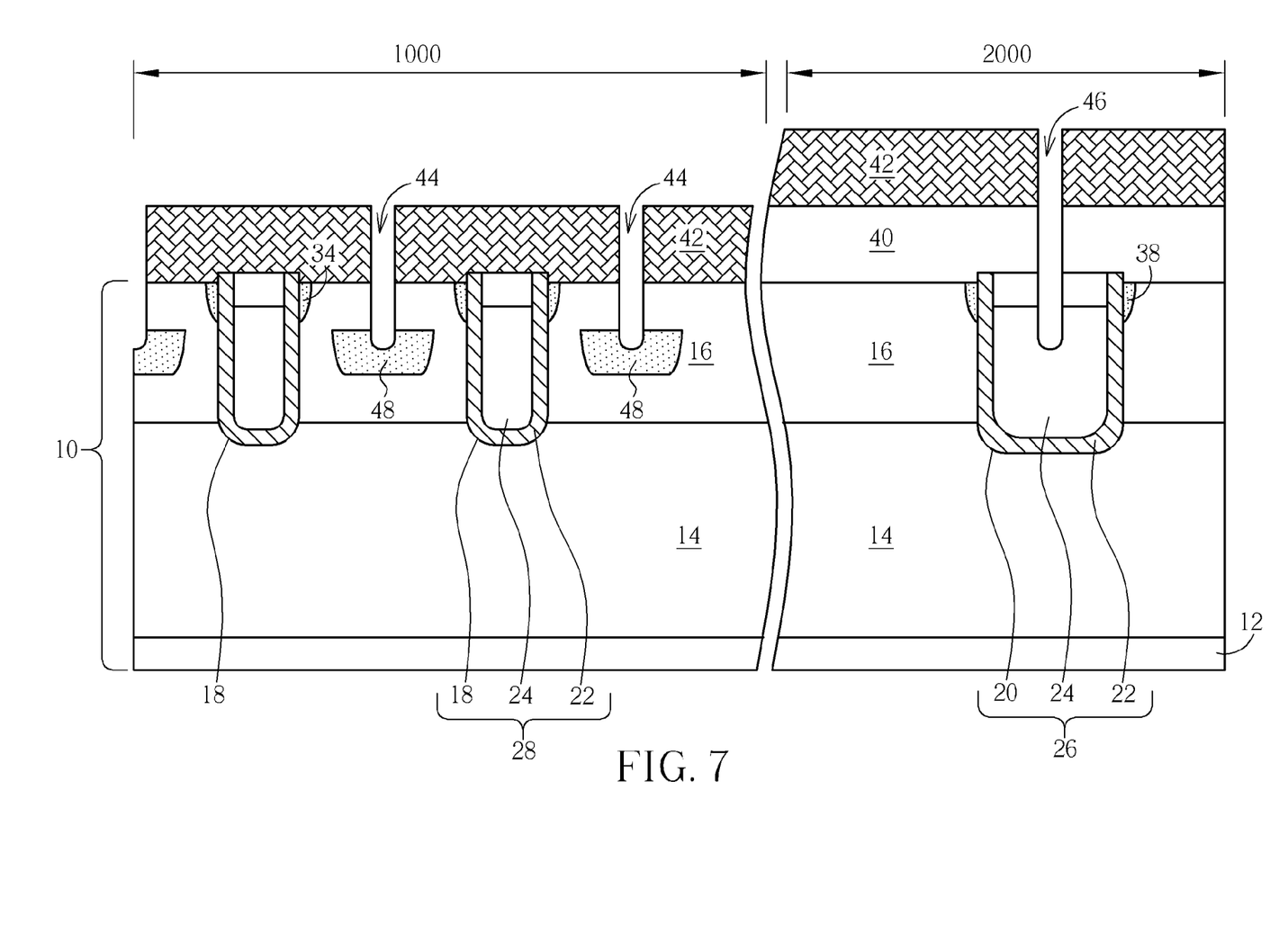

As shown in FIG. 6, a dielectric layer 40 covering the second semiconductor layer 16 is formed. As shown in FIG. 7, a lithographic and etching process is performed by using a first photo mask (not shown) to remove the dielectric layer 40 within the active region 1000 so that the second semiconductor layer 16 in the active region 1000 is exposed. Then, a patterned photoresist 42 covering the second semiconductor layer 16 and the dielectric layer 40 is formed. Later, the second semiconductor layer 16 in the active region is etched by taking the patterned photoresist 42 as a mask. Thus, a first contact hole 44 is formed in the second semiconductor layer 16 at a side of the source doped region 34. Furthermore, the dielectric layer 40, the insulating layer 32, and the gate material layer 24 in peripheral region 2000 are etched to form a second contact hole 46 in the dielectric layer 40, the insulating layer 32, and the gate material layer 24. After that, an ion implantation process is performed to form a heavily doped region 48 in the second semiconductor layer 16 around the bottom of the first contact hole 44. The conductive type of the heavily doped region 48 is the same as the conductive type of the second semiconductor layer 16. According to a preferred embodiment of the present invention, P-type is the better conductive type, and the dopant concentration in the heavily doped region 48 is higher than the dopant concentration in the second semiconductor layer 16. Besides, the number of the first contact hole 44 is not limited. Basically, the first contact hole 44 is better formed at two sides of each of the trenches 18 within the active region 1000. Because the position of the heavily doped region 48 is related to the position of the first contact hole 44, the heavily doped region 48 is also formed at two sides of each of the trenches 18 within the active region 1000.

Figure 8:
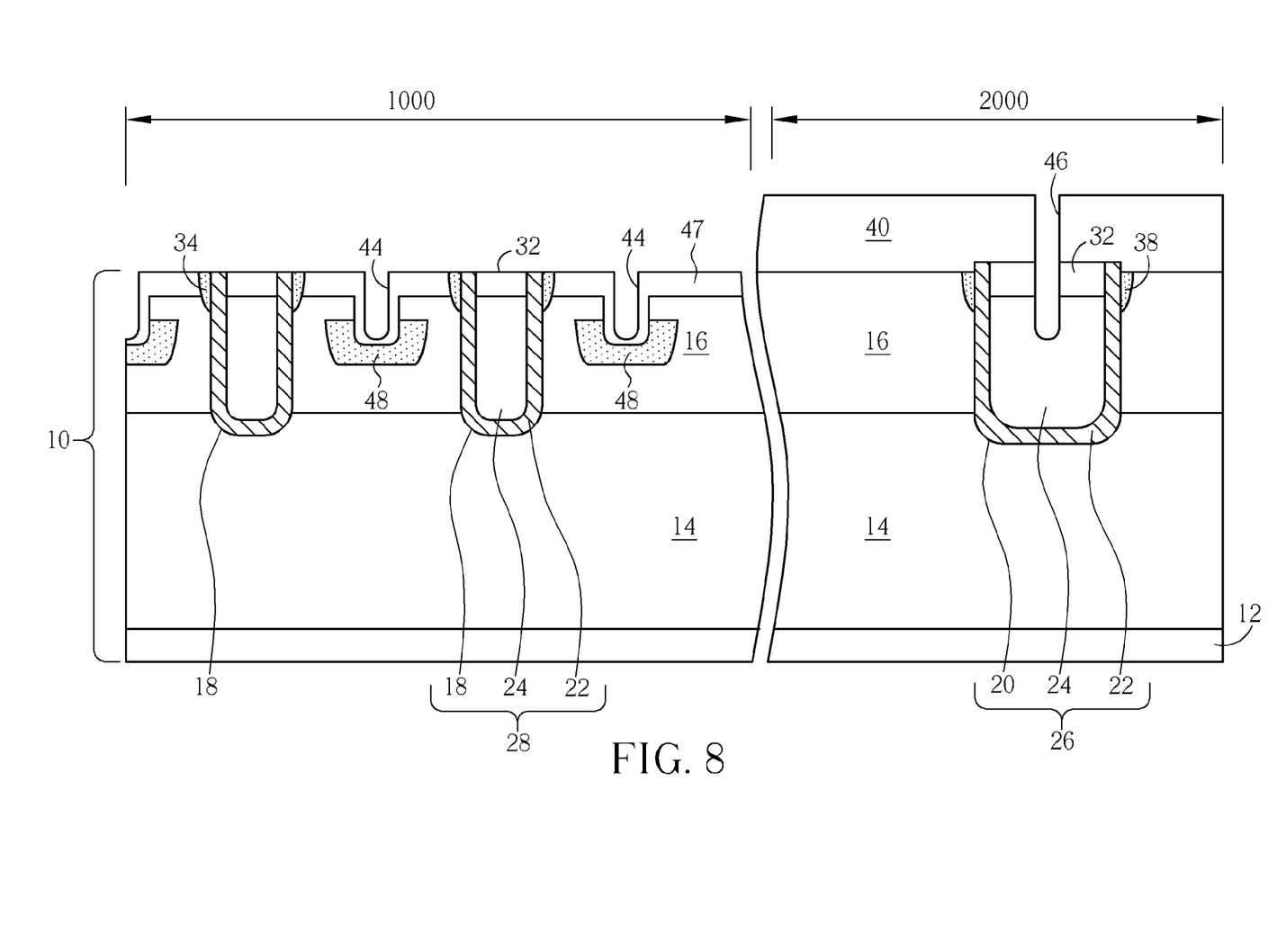

As shown in FIG. 8, $P^+$ ion implantation is performed blankly to form a $P^+$ doped region 47 in the surface of the second semiconductor layer 16 and around the first contact hole 44 within the active region 1000. The depth of the $P^+$ doped region 47 is smaller than the depth the source doped region 34.

Figure 9:
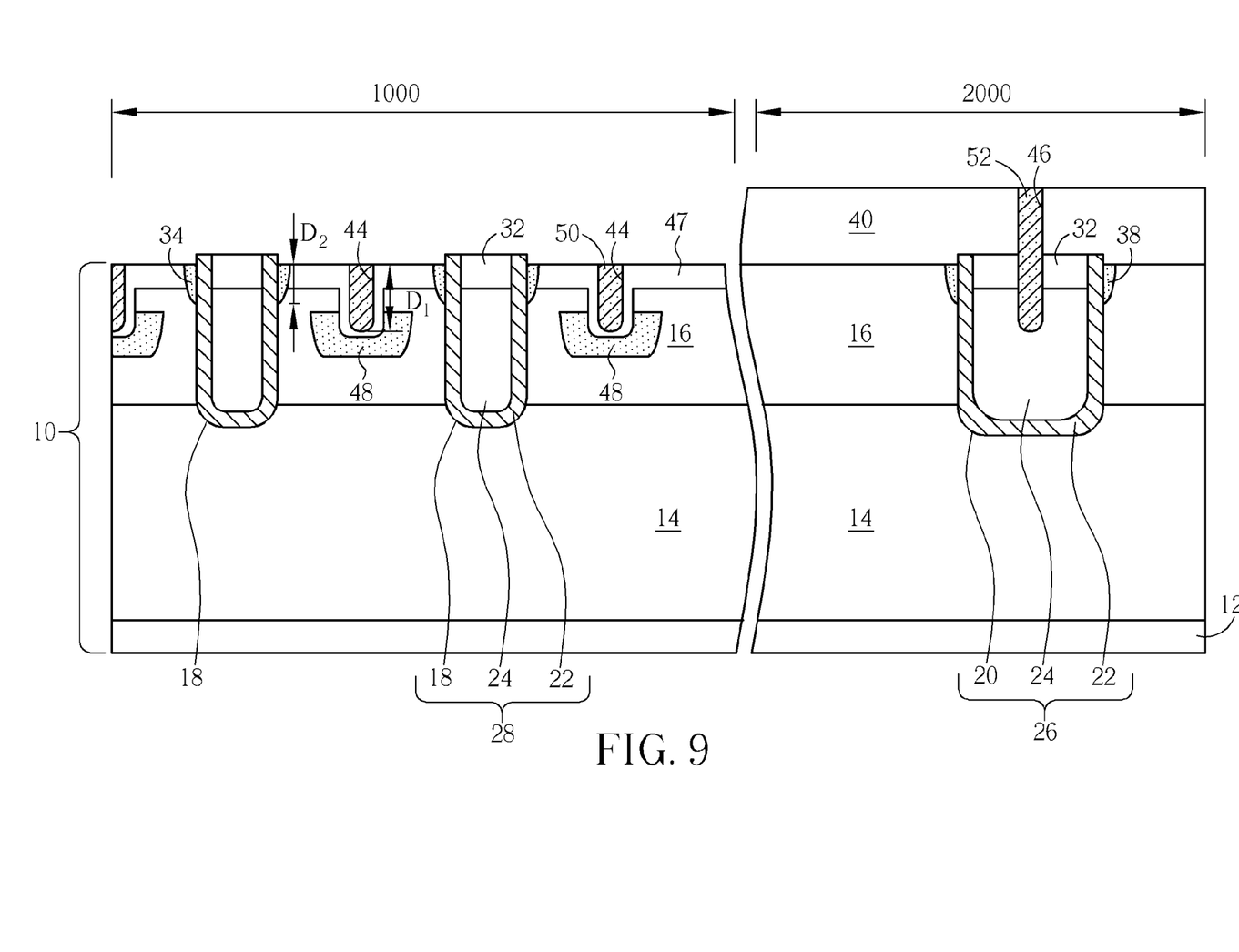

As shown in FIG. 9, the patterned photoresist 42 is removed. Then, a metal layer 48 fills into the first contact hole 44 and the second contact hole 46. The metal layer 48 inside the first contact hole 44 and the second contact hole 46 serves as a first contact plug 50 and a second contact plug 52. The first contact plug 50 connects electrically to the heavily doped region 48, and the second contact plug 52 connects electrically to the gate material layer 24. The first contact plug 50 has a maximum depth $D_1$ and the source region 34 has a maximum depth of $D_2$. According to the presented embodiment, the maximum depth of $D_1$ is larger than the maximum depth of $D_2$. However, according to different product requirements, the maximum depth of $D_1$ could be smaller than the maximum depth of $D_2$. For example, the maximum depth of $D_1$ can be smaller than the maximum depth of $D_2$ at 0.2 μm. It should be noted that the first contact plug 50 does not contact with the source doped region 34.

Figure 10:
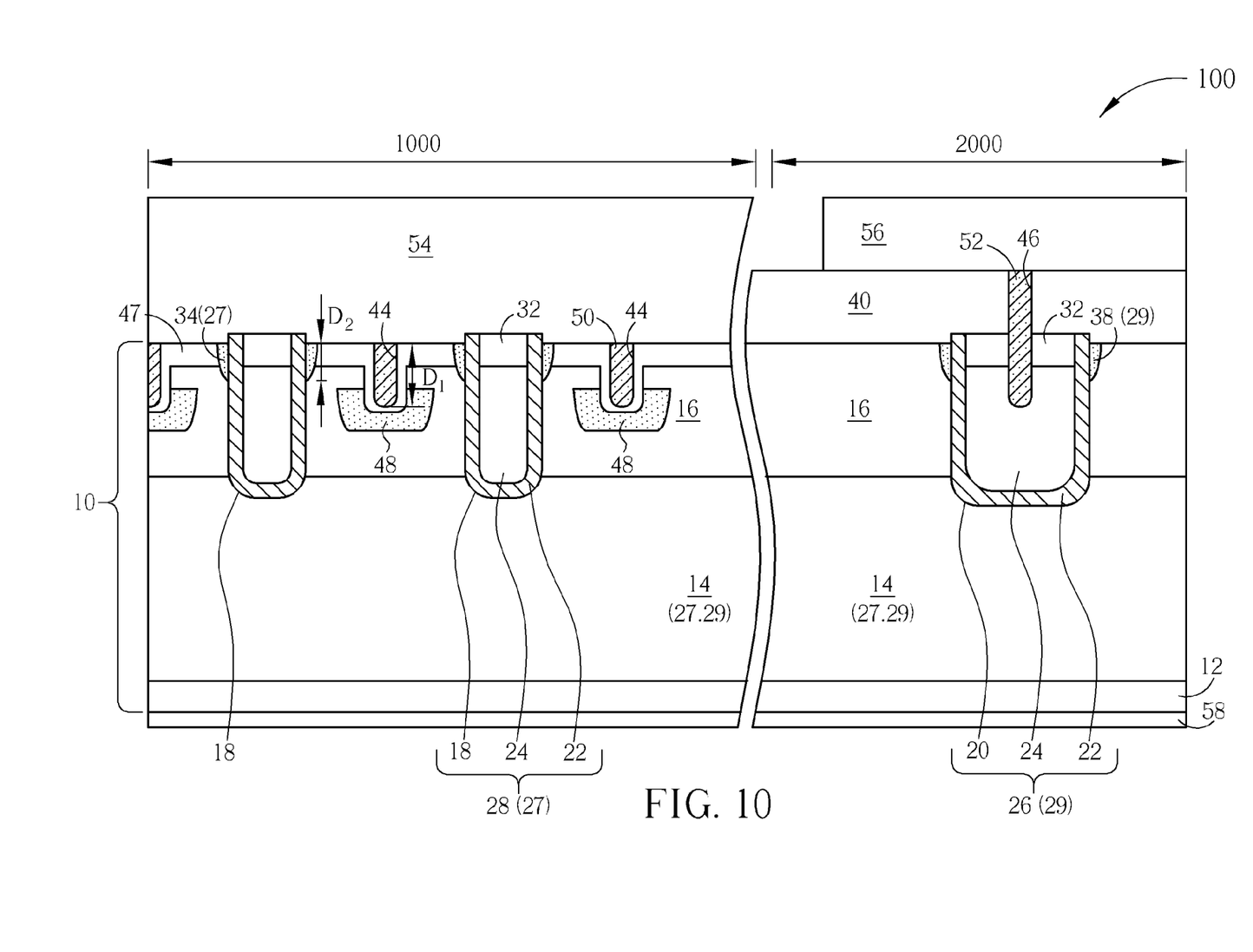

As shown in FIG. 10, a source wire 54, a gate wire 56, and a drain wire 58 are formed. The drain wire 54 covers the top layer of the second conductive layer 16 within the active region 1000. For example, the drain wire 54 covers the first contact plug 50, the source doped regions 34, 38, the gate oxide layer 22, and the insulating layer 32 within the second semiconductor layer 16. The gate wire 56 covers the dielectric layer 40 and connects electrically to the second contact plug 52. The drain wire 58 is disposed on the body 12 opposed to the first semiconductor layer 14. In addition, the resistance between the second conductive layer 16 and the first contact plug 50, and between the second conductive layer 16 and the source wire 54 can be reduced because of the $P^+$ doped region 47. Now, the preferred invention of the power device with low parasitic transistor 100 is completed.

According to another embodiment, the fabrication process could be adjusted case by case. Please refer to FIG. 11 to FIG. 12, which illustrate another fabrication process diagram in another preferred embodiment. The fabrication process of FIG. 11 follows the fabrication process of FIG. 6. The devices with the same function are labeled by the same numeral.

Figure 11:
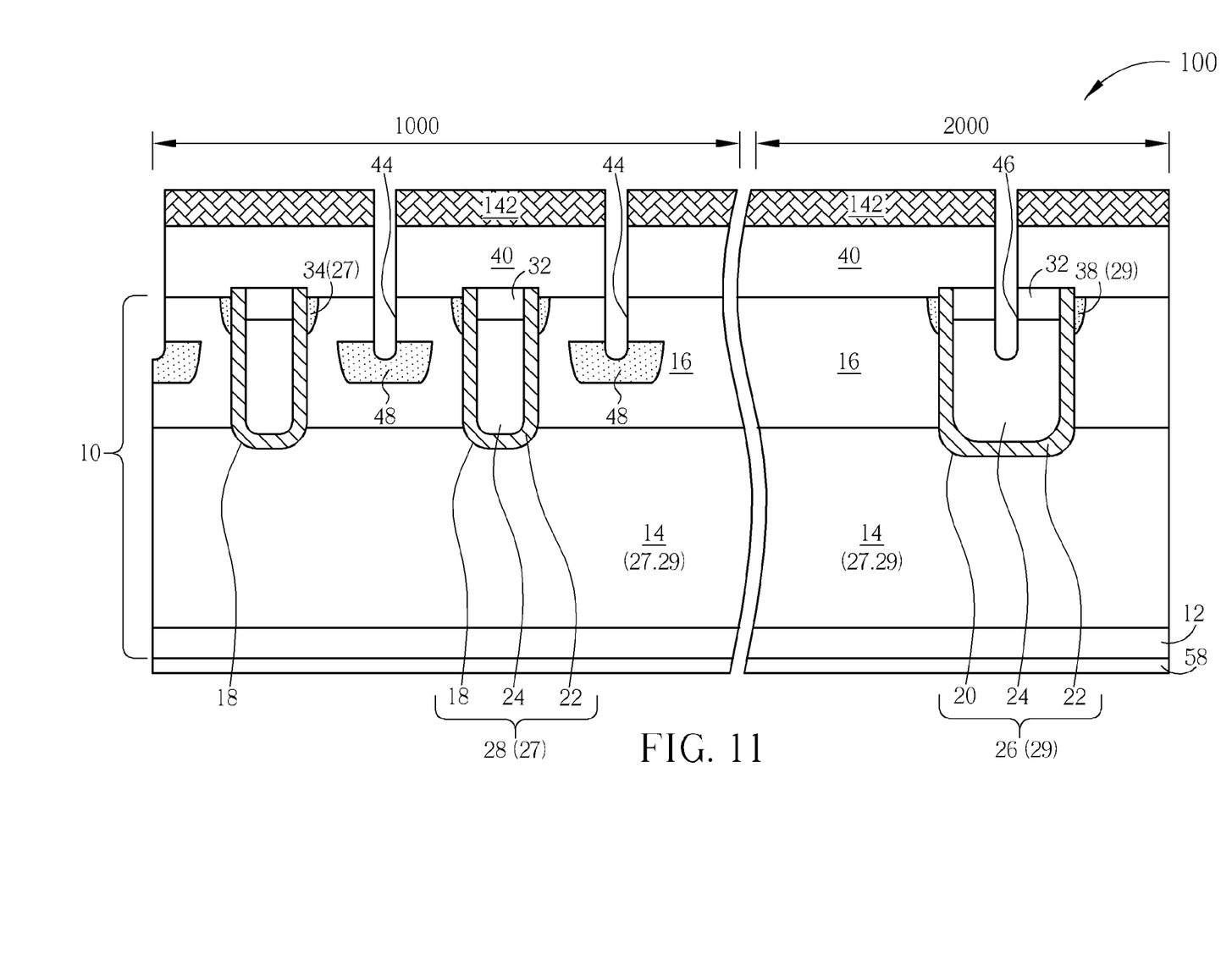
FIGS. 11-12 are schematic, cross-sectional diagrams showing a method of fabricating a power device with low parasitic transistor in accordance with the second embodiment of this invention.

After the dielectric layer 40 is formed to cover the second conductive layer 16, a patterned photoresist 142 covering a part of the dielectric layer 40 is formed as shown in FIG. 11.

Figure 12:
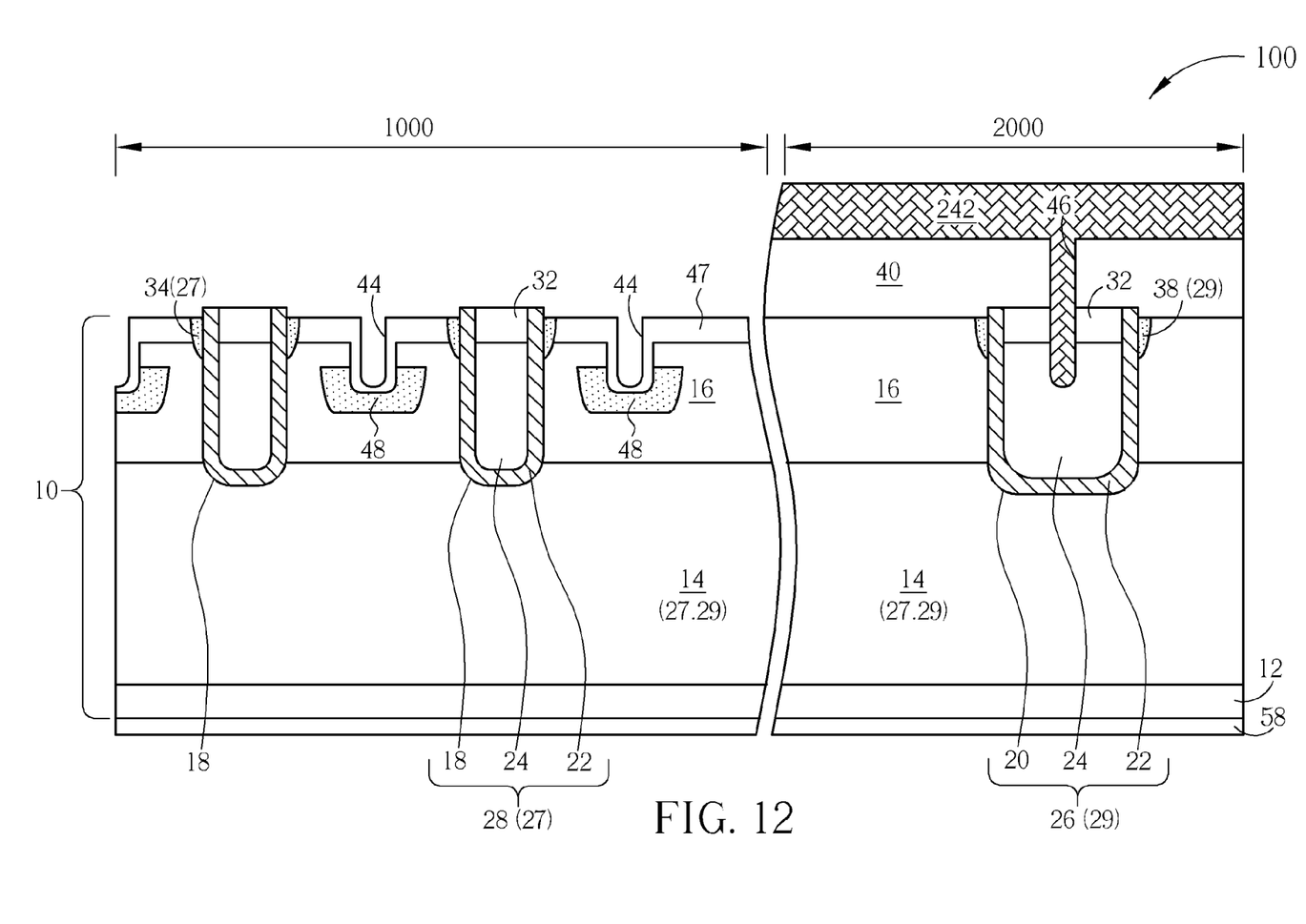

Later, the second conductive layer 16 within the 1000 is etched by using the patterned photoresist 142 as a mask to form the first contact hole 44 in the dielectric layer 40 at a side of the source doped region 34 and in the second semiconductor layer 16. Meanwhile, a second contact hole 46 is formed in the dielectric layer 40, the insulating layer 32, and the gate material layer 24 within the peripheral region 2000. As shown in FIG. 12, the patterned photoresist 142 is removed. Then, a patterned photoresist 242 is formed to cover the dielectric layer 40 within the peripheral region 2000, and the patterned photoresist 242 also fills the second contact hole 46. Later, the dielectric layer 40 within the active region 1000 is removed. After that, $P^+$ ion implantation is performed to form a layer of $P^+$ doped region 47 within the surface of the second semiconductor region 16 and at the sides of the first contact hole 44 within the active region 1000 by taking the dielectric layer 40 within the peripheral region 2000 as a mask. The depth of the $P^+$ doped region 47 is smaller than that of the source doped region 34. Then, the patterned photoresist 242 is removed. Please refer to FIG. 9. A metal layer 48 fills into the first contact hole 44 and the second contact hole 46. The metal layer 48 in the first contact hole 44 and the second contact hole 46 serves as a first contact plug 50 and a second contact plug 52, respectively.

As shown in FIG. 10, a source wire 54, a gate wire 56, and a drain wire 58 are formed. The source wire 54 covers the top layer of the second conductive layer 16 within the active region 1000. More specifically, the source wire 54 covers the first contact plug 50, the source doped regions 34, 38, the gate oxide layer 22, and the insulating layer 32 in the second semiconductor layer 16. The gate wire 56 covers the dielectric layer 40 and connects electrically with the second contact plug 52. The drain wire 58 is disposed on the body 12 opposed to the first semiconductor layer 14. In addition, the resistance between the second conductive layer 16 and the first contact plug 50, and between the second conductive layer 16 and the source wire 54 can be reduced because of the $P^+$ doped region 47. Now, the preferred invention of the power device with low parasitic transistor 100 is completed.

According to another preferred embodiment, a recessed structure in the peripheral region in the power device with low parasitic transistor could be replaced by a planar gate structure. The planar gate structure may be formed after a source doped region is completed in FIG. 5. Then, a dielectric layer is formed as the step described in FIG. 6. And the following steps are the same as those shown in FIG. 7 to FIG. 10.

The invention provides the power device with low parasitic transistor 100, as shown in FIG. 10. The power device with low parasitic transistor 100 includes the substrate 10 which comprises the body 12, the first semiconductor layer 14, and the second semiconductor layer 16 disposed on the body 12 in sequence. The substrate 10 can be divided into an active region 1000 and a peripheral region 2000. The trench type transistor 27 is located in the active region 1000 of the substrate 10. The trench type transistor 27 comprises the recessed gate structure 26 embedded into the second semiconductor layer 16 and extending into the first semiconductor layer 14, and a source doped region 34 located at two sides of the first recessed gate structure 26. The gate oxide layer 22 is disposed on the sidewall of the trench 18. A gate material layer 24 fills into the trench 18. In addition, the first semiconductor layer 14 serves as a drain doped region of the trench type transistor 27. It is worth noting that a first heavily doped region 48 is disposed in the second semiconductor layer 16 within the active region 1000, and the first heavily doped region 48 is disposed at a side of the source doping region 34. A first contact plug 50 is disposed in the second semiconductor layer 16, and the bottom of the contact plug 50 contacts the heavily doped region 48. A source wire 54 covers the top surface of the second semiconductor layer 16, the drain doped region 34, and the first contact plug 50 within the active region 1000 so that the heavily doped region 48 and the source doped region 34 have the same electric potential. It should be noted that the first contact plug 50 does not contact the source doped region 34.

The body 12 may comprise silicon such as silicon doped with $N^+$ or $P^+$, and the first semiconductor layer 14 which has the same conductive type as the body 12 is preferably formed by epitaxy growth process. The second conductor layer 16 has the conductive type opposed to the first semiconductor layer 14. According to a preferred embodiment of the invention, the body 12 is an $N^+$ type, the first semiconductor layer 14 is an $N^-$ type epitaxy layer, the second semiconductor 16 is a P-type doped region, the source doped region 34 is an N-type doped region, and the P dopant concentration in the heavily doped region 48 is larger than the P dopant concentration in the second semiconductor layer 16. The first contact plug 50 has a maximum depth $D_1$, the source doped region 34 has a maximum depth of $D_2$, and the maximum depth of $D_1$ is larger than the maximum depth of $D_2$. The drain wire 58 is on a surface of the body 12 opposed to the first semiconductor layer 14. In addition, the layer of $P^+$ doped region 47 is disposed on the surface of the second semiconductor layer 16 within the active region 1000 and at the peripheral of the first contact hole 50. The depth of the $P^+$ doped region 47 is smaller than the depth the source doped region 34.

The invention of the power device with low parasitic transistor includes the peripheral gate structure. For example, a recessed gate structure 26 is embedded into the second semiconductor layer 16. The recessed gate structure 26 comprises a trench 20, a gate oxide layer 22 located on the sidewall of the trench 20, and a gate material layer 24 filling into the trench 20. An insulating layer 32 can be selectively deposited on the gate material layer 24. A dielectric layer 40 covers the recessed gate structure 28 within the peripheral region 2000. A second contact plug 50 penetrates the dielectric layer 52 and the insulating layer 32 to connect to the gate material layer 34. The gate wire 56 can be disposed on the dielectric layer 40 to connect to the second contact plug 52. In addition, a source doped region 38 can be disposed selectively at two sides of the recessed gate structure 28.

Figure 13:
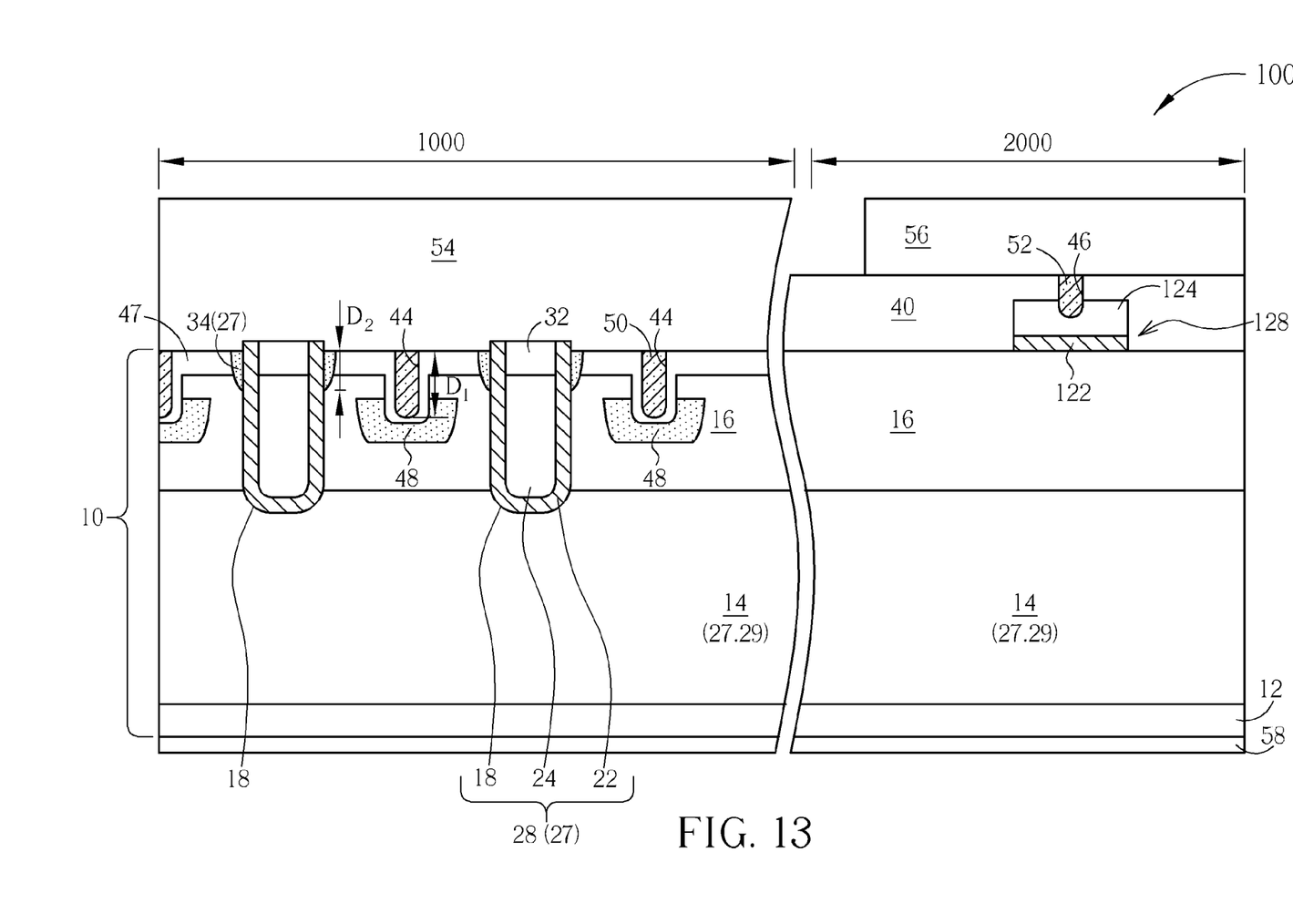
FIG. 13 is a sectional view of a power device with low parasitic transistor in accordance with another embodiment of this invention

The FIG. 13 shows another power device with low parasitic transistor according to another preferred embodiment of the present invention. The difference in the power devices shown in FIG. 13 and FIG. 10 is that the gate structure in the peripheral region in FIG. 13 is a planar gate structure. Therefore, the following content is focused on the description of planar gate structure, and the description of the other elements please refer to the description of the embodiment in FIG. 10.

As shown in FIG. 13, the peripheral gate structure can be the planar gate structure 128 disposed on the second semiconductor layer 16. The planar gate structure 128 includes a gate oxide layer 122 and a gate material layer 124. The dielectric layer 40 covers the planar gate structure 128. The second contact plug 52 penetrates dielectric layer 40 and connects to the gate material layer 124. In addition, a gate wire 56 covers the dielectric layer 40 and connects to the second contact plug 52.

The invention uses a doped region with high P dopant concentration to prevent the depletion region from contacting the source doping region during applying reverse voltage. Therefore, the breakdown voltage of the power device is increased. Because both the P dopant region and the source doped region connect electrically to the source wire, the P dopant region and the source doped region have the same voltage potential. In this circumstance, the parasitic transistor in power device can be prevented from turning on.

Those skilled in the art will readily observe that numerous modifications and alterations of the device and method may be made while retaining the teachings of the invention.

What is claimed is:

1. A power device with low parasitic transistor, comprising:
    a substrate including a body, a first semiconductor layer, and a second semiconductor layer disposed on the substrate in sequence, wherein the substrate is divided into an active region and a peripheral region;
    a trench type transistor located in the active region of the substrate, and the trench type transistor comprising:
    a first recessed gate structure embedded into the second semiconductor layer and extending into the first semiconductor layer; and
    a source doped region located at two sides of the first recessed gate structure, wherein the first semiconductor layer serves as a drain doped region of the trench type transistor;
    a first heavily doped region disposed in the second semiconductor layer within the active region, and the first heavily doped region being disposed at one side of the source doped region, wherein the first heavily doped region and the second semiconductor layer have the same conductive type, and the first heavily doped region does not contact with the source doped region;
    a first contact plug disposed in the second semiconductor layer, and the bottom of the first contact plug contacting the first heavily doped region; and
    a source wire contacting the top of the drain doped region within the active region and the top of the first contact plug.

2. The power device with low parasitic transistor according to claim 1, wherein the first semiconductor layer has a first conductive type, and the second semiconductor layer has a second conductive type.

3. The power device with low parasitic transistor according to claim 2, wherein the first conductive type is N-type, and the second conductive type is P-type.

4. The power device with low parasitic transistor according to claim 3, wherein the P-type dopant concentration of the first heavily doped region is higher than the P-type dopant concentration of the second semiconductor layer.

5. The power device with low parasitic transistor according to claim 1, wherein the maximum depth of the source doped region is smaller than the maximum depth of the first contact plug.

6. The power device with low parasitic transistor according to claim 1, further comprising:
    a peripheral gate structure disposed at the peripheral region;
    a dielectric layer covering the peripheral gate structure within the peripheral region;
    a second contact plug penetrating the dielectric layer and connecting to the peripheral gate structure; and
    a gate wire covering the dielectric layer and contacting the second contact plug.

7. The power device with low parasitic transistor according to claim 6, wherein the peripheral gate structure comprises a second recessed gate structure inlaid in the second semiconductor layer.

8. The power device with low parasitic transistor according to claim 7, further comprising a second heavily doped region disposed at two sides of the second recessed gate structure.

9. The power device with low parasitic transistor according to claim 1, further comprising:
a drain wire located on a surface of the substrate opposing to the first semiconductor layer.

10. The power device with low parasitic transistor according to claim 1, wherein the first contact plug does not contact the source doped region.

11. A power device with low parasitic transistor, comprising:
a substrate including a body, a first semiconductor layer, and a second semiconductor layer disposed on the substrate in sequence, wherein the substrate is divided into an active region and a peripheral region;
a trench type transistor located in the active region of the substrate, and the trench type transistor comprising:
a first recessed gate structure embedded into the second semiconductor layer and extending into the first semiconductor layer; and
a source doped region located at two sides of the first recessed gate structure, wherein the first semiconductor layer serves as a drain doped region of the trench type transistor;
a first heavily doped region disposed in the second semiconductor layer within the active region, and the first heavily doped region being disposed at one side of the source doped region, wherein the first heavily doped region and the second semiconductor layer have the same conductive type;
a first contact plug disposed in the second semiconductor layer, and the bottom of the first contact plug contacting the first heavily doped region;
a source wire contacting the top of the drain doped region within the active region and the top of the first contact plug;
a peripheral gate structure disposed at the peripheral region;
a dielectric layer covering the peripheral gate structure within the peripheral region;
a second contact plug penetrating the dielectric layer and connecting to the peripheral gate structure; and
a gate wire covering the dielectric layer and contacting the second contact plug.

12. The power device with low parasitic transistor according to claim 11, wherein the peripheral gate structure comprises a second recessed gate structure inlaid in the second semiconductor layer.

13. The power device with low parasitic transistor according to claim 12, further comprising a second heavily doped region disposed at two sides of the second recessed gate structure.

14. The power device with low parasitic transistor according to claim 11, wherein the first semiconductor layer has a first conductive type, and the second semiconductor layer has a second conductive type.

* * * * *